(12) United States Patent
Fujikawa et al.

(10) Patent No.: US 8,163,409 B2
(45) Date of Patent: *Apr. 24, 2012

(54) EVALUATION METHOD FOR SAFETY UPON BATTERY INTERNAL SHORT CIRCUIT, EVALUATION DEVICE FOR SAFETY UPON BATTERY INTERNAL SHORT CIRCUIT, BATTERY, BATTERY PACK, AND MANUFACTURING METHOD FOR BATTERY AND BATTERY PACK

(75) Inventors: Masato Fujikawa, Osaka (JP); Shinji Kasamatsu, Osaka (JP); Hajime Nishino, Nara (JP); Mikinari Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 1010 days.

This patent is subject to a terminal disclaimer.

(21) Appl. No.: 11/798,630

(22) Filed: May 15, 2007

(65) Prior Publication Data
US 2008/0143337 A1 Jun. 19, 2008

(30) Foreign Application Priority Data

Dec. 15, 2006 (JP) ................................ 2006-338114
Feb. 6, 2007 (JP) ................................ 2007-026742

(51) Int. Cl.
*H01M 2/00* (2006.01)
*H01M 10/48* (2006.01)
(52) U.S. Cl. .......................................... 429/61; 429/90
(58) Field of Classification Search .................. 429/61,
429/62, 94, 90; 324/426; 361/86, 93.8; 73/821
See application file for complete search history.

(56) References Cited

U.S. PATENT DOCUMENTS

| | | | |
|---|---|---|---|
| 6,054,233 A * | 4/2000 | Vourlis | 429/61 |
| 6,872,491 B2 * | 3/2005 | Kanai et al. | 429/223 |
| 8,081,000 B2 * | 12/2011 | Kasamatsu et al. | 324/426 |
| 2002/0150820 A1 * | 10/2002 | Kanai et al. | 429/231.1 |
| 2004/0053134 A1 * | 3/2004 | Ozaki et al. | 429/231.1 |
| 2004/0096733 A1 * | 5/2004 | Shibamoto et al. | 429/94 |
| 2005/0253591 A1 * | 11/2005 | Kasamatsu et al. | 324/432 |

FOREIGN PATENT DOCUMENTS

| | | |
|---|---|---|
| JP | 10-106530 | 4/1998 |
| JP | 11-102729 | 4/1999 |
| JP | 2004-247064 | 9/2004 |

OTHER PUBLICATIONS

UL Standard 1642; Jun. 24, 1999.*

* cited by examiner

*Primary Examiner* — Richard V Muralidar
(74) *Attorney, Agent, or Firm* — McDermott Will & Emery LLP

(57) ABSTRACT

A method for evaluating the safety of a battery under an internal short-circuit condition. The method for evaluating an internal short-circuit of a battery is characterized in that a short-circuit can be caused at a desired location inside the battery. According to the evaluation method of the invention, the evaluation result is not affected by the constitution of the outermost part of the battery unlike nail penetration tests which are conventional evaluation methods. Also, unlike crush tests which are conventional evaluation methods, the locations of short-circuits do not vary among tests and the safety under an internal short-circuit condition can be evaluated accurately.

49 Claims, 4 Drawing Sheets

EVALUATION METHOD FOR SAFETY UPON BATTERY INTERNAL SHORT CIRCUIT, EVALUATION DEVICE FOR SAFETY UPON BATTERY INTERNAL SHORT CIRCUIT, BATTERY, BATTERY PACK, AND MANUFACTURING METHOD FOR BATTERY AND BATTERY PACK

FIELD OF THE INVENTION

The present invention relates to an evaluation method for safety upon battery internal short circuit, an evaluation device for safety upon battery internal short circuit, a battery, a battery pack, and a manufacturing method for a battery and a battery pack.

BACKGROUND OF THE INVENTION

Lithium secondary batteries, which are lightweight and have high energy density, are mainly commercialized as the power source for portable devices. Also, lithium secondary batteries are currently receiving attention as large-sized, high-output power sources (e.g., power sources for automobiles), and their active development is underway.

In lithium secondary batteries, an insulating layer is provided between the positive electrode and the negative electrode. The insulating layer has the function of electrically insulating the positive and negative electrode plates from each other while retaining an electrolyte. A resin insulating layer is widely used, but such a resin insulating layer easily shrinks. Thus, when a lithium secondary battery is stored in a very high temperature environment for an extended period of time, an internal short-circuit tends to occur due to a physical or direct contact between the positive electrode and the negative electrode. The prevention of an internal short-circuit is becoming an increasingly important technical problem to be solved particularly in view of the recent trend of the insulating layer becoming increasingly thinner as the capacity of lithium secondary batteries is becoming increasingly higher. Once an internal short-circuit occurs, the short-circuit further expands due to Joule's heat generated by the short-circuit current. In some cases, the battery may overheat.

It is also very important to assure safety when batteries are internally short-circuited. Thus, techniques to enhance the safety of batteries under internal short-circuit conditions are being extensively developed. For example, Japanese Laid-Open Patent Publication No. 2004-247064 proposes a technique in which insulating tape is affixed to the exposed part of a current-collecting terminal of a positive electrode or negative electrode to prevent an internal short-circuit between the current-collecting terminals. Also, Japanese Laid-Open Patent Publication No. Hei 10-106530 proposes a technique in which an ion-permeable insulating layer composed of ceramic particles and a binder is printed on an electrode plate.

Further, to assure safety under an internal short-circuit condition, it is also very important to accurately evaluate the safety of a battery under an internal short-circuit condition. Battery evaluation tests for evaluating exothermic behavior under an internal short-circuit condition as a safety item of batteries such as lithium ion secondary batteries are defined, for example, by UL standards for lithium batteries (UL1642) and Standards of Battery Association of Japan (SBA G1101-1997 lithium secondary battery safety evaluation standard guidelines). These test methods are employed, for example, in Japanese Laid-Open Patent Publication No. Hei 11-102729 to evaluate battery safety.

Conventional evaluation tests include, for example, nail penetration tests and crush tests. A nail penetration test is an internal short-circuit test which is conducted by causing a nail to penetrate through a battery from its side face or sticking a nail thereinto. When a nail is stuck, a short-circuit occurs between the positive electrode, the negative electrode, and the nail inside the battery, so that a short-circuit current flows through the short-circuit while generating Joule's heat. Safety is evaluated by observing changes in battery temperature, battery voltage, etc., based on these phenomena. Also, a crush test is an internal short-circuit test which is performed by physically deforming a battery by using a round bar, square bar, flat plate, etc. In this manner, an internal short-circuit is caused between the positive electrode and the negative electrode, and safety is evaluated by observing changes in battery temperature, battery voltage, etc.

However, these conventional battery evaluation methods fail to accurately evaluate safety under internal short-circuit conditions. Also, in considering the uses of a battery, it is necessary to understand which level of safety performance the battery has in the event of an internal short-circuit, such as "generates no heat" or "generates a little heat". However, since conventional methods fail to accurately evaluate safety under internal short-circuit conditions, the level of safety is not specified.

First, with respect to safety under internal short-circuit conditions, the present inventors have found that the safety of a battery in the event of an internal short-circuit changes greatly depending on the location of the short-circuit inside the battery (e.g., distance from battery surface, exposed part of current-collecting terminal, electrode active material layer), the shape of the battery, etc. For example, the safety in the event of a short-circuit near the surface of a battery is apparently high, compared with that in the event of a short-circuit at an inner part of the battery, because of the influence of heat radiation. Also, when short-circuits occur simultaneously at a location where low-resistant members such as electrode current-collecting terminals are opposed to each other and a location where relatively high-resistant members such as electrode active material layers are opposed to each other, most of the short-circuit current resulting from the short-circuits flows through the location where the low-resistant current-collecting terminals are opposed to each other. Hence, most of the Joule's heat is also generated at the location where the current-collecting terminals are opposed to each other, not the location where the active material layers with poor thermal stability are opposed to each other. As a result, the safety under internal short-circuit conditions is apparently high.

That is, depending on where a short-circuit occurs, even a battery which can be more dangerous may be improperly evaluated as safe if the evaluation method is not appropriate. In order to accurately evaluate the safety of a battery under an internal short-circuit condition, it is very important to cause an internal short-circuit at a desired location that is not in an area leading to improper evaluation of being apparently safe, in view of the battery constitution such as shape and internal structure.

In the case of nail penetration tests, the locations of short-circuits are limited to an outer part of a battery, particularly an outermost part. The evaluation results are therefore greatly affected by the constitution of the outer part of the battery. For example, the amount of heat W (W) generated by a short-circuit in a nail penetration test is as follows:

$$W = V^2 \times R1/(R1+R2)^2$$

where V represents the battery voltage (V), R1 represents the resistance (Ω) of the short-circuit, and R2 represents the internal resistance (Ω) of the battery. Thus, as the resistance of the short-circuit increases, the amount of heat generated by the short-circuit becomes maximum, and as the resistance of the short-circuit decreases, the amount of heat generation decreases. That is, in a nail penetration test, when the outermost part where a short-circuit can occur is provided with a low resistant part, such as an exposed part of a current-collecting terminal on which there is no active material layer, the evaluation result becomes "safe". However, if a foreign object enters such a battery, the battery may become internally short-circuited at a given location, depending on the size, shape, hardness, etc., of the foreign object. That is, nail penetration test methods cannot accurately evaluate safety under possible internal short-circuit conditions in the market.

Also, with respect to crush test methods, it has been found from the analysis of short-circuit behavior in crush tests that a plurality of locations are short-circuited at one time or the short-circuit location varies among tests. It is therefore believed that crush test methods also cannot accurately evaluate safety under internal short-circuit conditions.

BRIEF SUMMARY OF THE INVENTION

An object of the present invention is to conduct a short-circuit test at a desired location inside a battery, evaluate the safety of the battery under an internal short-circuit condition in a comprehensive manner, and provide a method and device for evaluating an internal short-circuit of a battery to specify its safety level.

Another object of the present invention is to provide a method for producing a battery or battery pack whose safety has been specified by the method or device for battery internal short-circuit evaluation, and a battery and a battery pack produced by these production methods.

That is, the present invention provides an evaluation method for safety upon battery internal short circuit. The battery includes: an electrode group including a positive electrode, a negative electrode, and an insulating layer for electrically insulating the positive and negative electrodes from each other, the electrodes and the insulating layer being wound or laminated; an electrolyte; a housing for housing the electrode group and the electrolyte; and a current-collecting terminal for electrically connecting the electrode group and the housing. A short-circuit can be caused at a desired location inside the battery.

In a first evaluation method, it is preferable to make an evaluation by using a first method for causing a short-circuit. In the first short-circuit causing method, the short-circuit is preferably caused by placing a foreign object at a location inside the electrode group of the battery where the positive electrode and the negative electrode are opposed to each other, and applying a pressure to the location at which the foreign object is placed to locally crush the insulating layer interposed between the positive and negative electrodes.

The application of the pressure is preferably stopped upon detection of the occurrence of the short-circuit.

The detection of the occurrence of the short-circuit is preferably detection of a drop in battery voltage.

The detection of the occurrence of the short-circuit is preferably detection of a change in battery temperature.

The detection of the occurrence of the short-circuit is preferably detection of sound produced by the internal short-circuit.

The detection of the occurrence of the short-circuit is preferably detection of light produced by the internal short-circuit.

The application of the pressure is preferably performed at a constant speed.

Preferably, the pressure applied is monitored and the application of the pressure is stopped upon detection of a decrease in the pressure.

The pressure applied is preferably constant.

The pressure applied is preferably 50 kg/cm$^2$ or less.

The foreign object is preferably a conductive foreign object.

In the first short-circuit causing method, the short-circuit is preferably caused by disassembling the battery, taking the electrode group out of the housing, placing a foreign object at a location inside the electrode group where the positive electrode and the negative electrode are opposed to each other, reassembling, and applying a pressure.

In the first short-circuit causing method, the short-circuit is preferably caused by disassembling the battery, taking the electrode group from the housing, and placing an insulating sheet and a foreign object in layers at a location inside the electrode group where the positive electrode and the negative electrode are opposed to each other, reassembling, pulling out the insulating sheet, and applying a pressure.

The insulating sheet is preferably heat-resistant.

Also, the foreign object is preferably placed before the electrolyte is injected in a battery production process.

Preferably, when the foreign object is placed before the electrolyte is injected in a battery production process, the battery is a lithium secondary battery, the foreign object includes Ni, Cu, stainless steel, or Fe, and the foreign object is placed between the negative electrode and the insulating layer at a location where the positive electrode and the negative electrode are opposed to each other.

Preferably, when the foreign object is placed before the electrolyte is injected in a battery production process, the battery is a lithium secondary battery, the foreign object includes Al or stainless steel, and the foreign object is placed between the positive electrode and the insulating layer at a location where the positive electrode and the negative electrode are opposed to each other.

Also, when the battery is a lithium secondary battery, the foreign object is preferably placed on an electrode such that $d \geq a+b$ where d represents the length of the foreign object in the direction perpendicular to the surface of the electrode, a represents the thickness of an active material layer of the positive electrode, and b represents the thickness of the insulating layer.

Also, the foreign object is preferably placed on an electrode such that $d \leq c+e+2b$ where d represents the length of the foreign object in the direction perpendicular to the surface of the electrode, b represents the thickness of the insulating layer, c represents the thickness of the positive electrode, and e represents the thickness of the negative electrode.

When the foreign object is anisotropic, the foreign object preferably has a shape selected from the group consisting of a horseshoe-like shape, a cone, a pyramid, a cylinder (length/diameter$\geq$1.5), and a rectangular parallelepiped (the length of the longest side/the length of the other two sides$\geq$1.5).

Instead of the first short-circuit causing method, a second short-circuit causing method may be used. In the second short-circuit causing method, the short-circuit is preferably caused by placing a shape memory alloy or bimetal at a location inside the electrode group of the battery where the positive electrode and the negative electrode are opposed to each other, and changing temperature to deform the shape memory alloy or bimetal and locally crush the insulating layer.

Instead of the first short-circuit causing method, a third short-circuit causing method may be used. In the third short-circuit causing method, the short-circuit is preferably caused by cutting out a certain area of the insulating layer where the positive electrode and the negative electrode are opposed to each other, and applying a pressure to the cut area.

The insulating layer is preferably cut before the electrode group is assembled.

Preferably, after the battery is disassembled and the electrode group is taken out of the housing, the insulating layer is cut and then the battery is reassembled.

Instead of the first short-circuit causing method, a fourth short-circuit causing method may be used. In the fourth short-circuit causing method, the short-circuit is preferably caused by cutting out a certain area of the insulating layer where the positive electrode and the negative electrode are opposed to each other, placing an insulating sheet over the cut area, assembling the electrode group, pulling out the insulating sheet, and applying a pressure to the cut area.

In a second evaluation method, preferably, the battery is a lithium secondary battery including a positive electrode that has an exposed part of a current-collecting terminal at an outermost part, and the short-circuit is caused by inserting a pressing member with a sharp edge into the battery until the pressing member reaches the exposed part of the current-collecting terminal while applying ultrasonic waves thereto, stopping the application of the ultrasonic waves, and then further inserting the pressing member into the battery.

In a third evaluation method, preferably, the battery is a lithium secondary battery including a positive electrode that has an exposed part of a current-collecting terminal at an outermost part, and the short-circuit is caused by cutting out the exposed part of the current-collecting terminal of the positive electrode at the outermost part without causing a continuing short-circuit, and then inserting a pressing member with a sharp edge into the cut part.

Preferably, the exposed part of the current-collecting terminal at the outermost part is cut by using an ultrasonic cutter.

In a fourth evaluation method, preferably, the battery is a battery including a wound electrode group, and the short-circuit is caused by inserting a pressing member with a sharp edge into a bottom of the battery.

In a fifth evaluation method, preferably, the battery is a battery including a laminated electrode group, and the short-circuit is caused by inserting a pressing member with a sharp edge into a side face of the battery.

In a sixth evaluation method, preferably, the battery is a battery including a wound electrode group, and the short-circuit is caused by inserting a pressing member with a sharp edge into a substantially central part of a bottom of the battery slantwise relative to a winding axis of the electrode group.

In a seventh evaluation method, a seventh method for causing a short-circuit is preferably used. In the seventh short-circuit causing method, the short-circuit is preferably caused by locally heating an outer part of the battery to a temperature equal to or higher than the melting point of the insulating layer to melt the insulating layer.

The heating is preferably performed by bringing a heat generator having a temperature equal to or higher than the melting point of the insulating layer close to the battery.

The heat generator is preferably a soldering iron.

The outer part of the battery heated to a temperature equal to or higher than the melting point of the insulating layer is preferably a connection area between the housing and the current-collecting terminal.

The heating is preferably performed after the electrode group is taken out of the housing of the battery.

Preferably, the battery is a lithium secondary battery including a positive electrode that has an exposed part of a current-collecting terminal at an outermost part, and the heating is performed after the electrode group is taken out of the housing of the battery and the exposed part of the current-collecting terminal is cut out.

Also, the present invention provides a manufacturing method for a battery or battery pack whose safety has been specified by the evaluation method for safety upon battery internal short circuit according to the present invention.

Also, the present invention provides a battery or battery pack produced by the above-mentioned battery or battery pack production method.

Also, the present invention provides an evaluation device for safety upon battery internal short circuit, including: a pressure applying section for applying a pressure to at least part of the battery; a pressure controlling section for adjusting the pressure applied by the pressure applying section; a battery information measuring section for measuring battery information; at least one short-circuit detecting section for determining whether or not an internal short-circuit has occurred by comparing a measurement result produced by the battery information measuring section with a reference value of an internal short-circuit, the short-circuit detecting section being configured to produce a detection signal of an internal short-circuit depending on a result of the determination; and at least one controlling section including a control circuit for producing a control signal depending on the detection signal from the short-circuit detecting section and a controller for detecting the control signal from the control circuit.

Further, it is preferable to include an ultrasonic generator for applying ultrasonic waves to at least part of the battery, and an ultrasonic controller for controlling the ultrasonic generator.

Also, the present invention provides a manufacturing method for a battery or battery pack whose safety has been specified by the evaluation device of the present invention.

Also, the present invention provides a battery or battery pack produced by the above-mentioned battery or battery pack production method.

According to the present invention, by using an evaluation method for safety upon battery internal short circuit by causing a short-circuit at a desired location inside the battery, the safety of the battery under the internal short-circuit condition can be accurately evaluated. That is, the evaluation results are not affected by the constitution, shape, etc., of the battery unlike conventional nail penetration test methods and the test results do not vary unlike crush tests. Further, by specifying the safety, the user can understand the safety level of the battery.

DETAILED DESCRIPTION OF THE INVENTION

Figure 1:
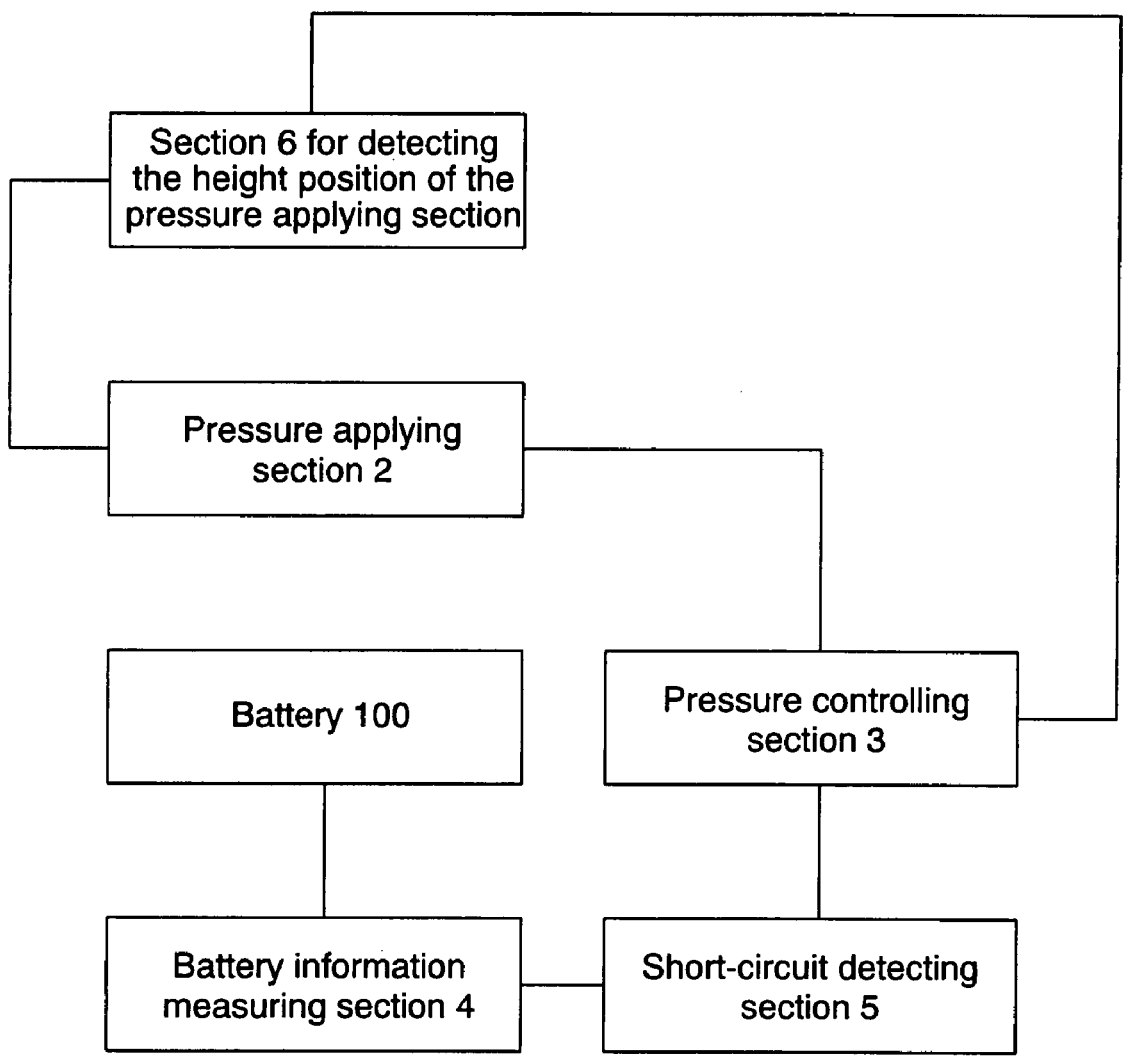
FIG. 1 is a block diagram showing the structure of an evaluation device for safety upon battery internal short circuit in an embodiment of the present invention.

The evaluation method for safety upon battery internal short circuit according to the present invention (hereinafter referred to as "evaluation method") can cause a short-circuit at a desired location inside a battery. By using the internal short-circuit evaluation method capable of causing a short-circuit at a desired location inside a battery, the safety under the internal short-circuit condition can be accurately evaluated without being affected by the local constitution of the battery.

Contrary to this, in nail penetration tests which are conventional internal short-circuit test methods, the locations of short-circuits are limited to an outermost part of a battery, and the evaluation results are therefore greatly affected by the constitution of the outermost part. For example, when an internal short-circuit occurs in an inner part of a battery, even if the battery has a large thermal capacity, the amount of heat generated in a nail penetration test can be reduced by modifying the constitution of the outermost part of the battery. Hence, the safety under possible internal short-circuit conditions in the market, particularly during distribution and operation, may not be evaluated accurately.

Further, in the present invention, by specifying the safety level of the battery determined by the above-mentioned evaluation method, optimum uses and application designs are possible. Examples of methods for specifying a safety level include a method of specifying in a commercial catalogue and a method of specifying on a battery or battery pack.

An example of the evaluation method of the present invention capable of causing a short-circuit at a desired location inside a battery is a first evaluation method. In the first evaluation method, it is preferable to make an evaluation by using a first method for causing a short-circuit. In the first short-circuit causing method, for example, a short-circuit is caused by placing a foreign object at a location inside an electrode group of a battery where positive and negative electrodes are opposed to each other, and applying a pressure to the location at which the foreign object is placed to locally crush the insulating layer. Since the foreign object can be placed at a desired location inside the battery, it is possible to freely select parts of the positive and negative electrodes that are to be short-circuited. Specifically, for example, the active material part of the positive electrode (active material layer) and the active material part of the negative electrode (active material layer), or the current-collecting terminal of the positive electrode and the active material part of the negative electrode (negative electrode active material layer) can be selected. Also, by changing the shape, hardness, or size of the foreign object, the pressure applied to cause the short-circuit, etc., the internal short-circuit to be caused can be controlled, which is preferable.

Further, in performing the evaluation, it is preferable to stop the application of the pressure upon detecting the occurrence of a short-circuit. In this case, the location of the internal short-circuit can be limited to a local area. A change in short-circuit area results in a variation in the amount of heat generated, so that the evaluation accuracy of safety under an internal short-circuit condition decreases. Methods for detecting a short-circuit include detection of a drop in battery voltage caused by the short-circuit, a temperature change (mainly a temperature rise), sound or light produced by the short-circuit, etc.

In applying the pressure, it is preferable to apply a pressure at a constant speed or apply a constant pressure. In this case, the variation in test results can be reduced and accurate evaluation is possible. When a pressure is applied at a constant speed, the pressure applied until the insulating layer is crushed is released upon occurrence of a short-circuit, so that the pressure decreases. This pressure decrease may be used to detect the occurrence of a short-circuit. More specifically, for example, the occurrence of a short-circuit is detected by monitoring the pressure applied and detecting a pressure decrease, and the application of the pressure is stopped. The pressure applied is preferably 50 kg/cm$^2$ or less. If it exceeds 50 kg/cm$^2$, the electrode group itself may become deformed, resulting in a variation in short-circuit area. Further, a short-circuit may occur in an area other than the location at which the foreign object is placed, which is not preferable.

The foreign object placed inside the battery is preferably conductive. In the case of a conductive foreign object, a short-circuit occurs as soon as the foreign object crushes the insulating layer. It is thus possible to stably cause a short-circuit.

A preferable example of methods for placing a foreign object inside a battery is a method of disassembling the battery, taking the electrode group out of the housing, placing a foreign object at a location inside the electrode group where the positive electrode and the negative electrode are opposed to each other, reassembling, and applying a pressure. By placing the foreign object after the fabrication of the battery, it is possible to avoid the occurrence of an internal short-circuit during a battery production process. Also, in placing the foreign object, it is more preferable to place an insulating sheet and a foreign object in layers, reassembling, pulling out the insulating sheet, and applying a pressure to cause a short-circuit. In this case, it is possible to prevent the occurrence of a short-circuit during the reassembling after the foreign object is placed. The insulating sheet is preferably made of a heat-resistant material.

Another method for placing a foreign object inside a battery is a method of placing it at a desired location before an electrolyte is injected in a battery production process (during fabrication). By placing the foreign object before the injection of the electrolyte, it is possible to make an evaluation while keeping the state of the battery produced, which is simple and preferable. Preferably, the foreign object placed inside the electrode group is electrochemically and chemically stable in the operating voltage range of the battery. For example, when the battery is a lithium secondary battery and a foreign object is placed between the negative electrode and the insulating layer, the foreign object preferably contains Ni, Cu, stainless steel, or Fe. When a foreign object is placed between the positive electrode and the insulating layer, the foreign object preferably contains Al or stainless steel.

When the battery is a lithium secondary battery, the size of the foreign object placed in the electrode group preferably satisfies $d \geq a+b$ where d represents the length of the foreign object in the direction perpendicular to the electrode surface, a represents the thickness of the positive electrode active material layer, and b represents the thickness of the insulating layer. In the case $d<a+b$, when a foreign object is placed between the active material layers of the positive and negative electrodes, a short-circuit occurs between the positive electrode active material layer and the negative electrode active material layer since the foreign object does not reach the current-collecting terminal of the positive electrode plate.

However, if the foreign object is large enough to cause a short-circuit between the positive electrode current-collecting terminal and the negative electrode active material layer, more Joule's heat is generated since the resistance of the positive electrode current-collecting terminal of the lithium secondary battery is lower than the resistance of the positive electrode active material layer. That is, when $d<a+b$, the safety under an internal short-circuit condition may be overestimated. It is therefore preferable that $d \geq a+b$.

Likewise, the size of the foreign object placed in the electrode group preferably satisfies $d \leq c+e+2b$ where d represents the length of the foreign object placed on the electrode in the direction perpendicular to the electrode surface, b represents the thickness of the insulating layer, c represents the thickness of the positive electrode, and e represents the thickness of the negative electrode. If the length d of the foreign object is greater than $c+e+2b$, short-circuits through two layers may simultaneously occur in the direction perpendicular to the electrode plate. Due to the resulting local variation in the amount of heat generated, the evaluation accuracy of safety under an internal short-circuit may lower.

The foreign object placed in the electrode group preferably has an anisotropic shape. When the foreign object is anisotropic, it can promptly crush the insulating layer locally to cause a short-circuit without applying an excessive pressure upon the pressure application. When the foreign object is not anisotropic such as spherical, it crushes the electrode due to excessive pressure application and it is thus difficult to control the state of the short-circuit. When the foreign object is anisotropic, it is more preferable that the foreign object have a shape selected from the group consisting of a horseshoe-like shape, a cone, a pyramid, a cylinder (length/diameter$\geq 1.5$), and a rectangular parallelepiped (the length of the longest side/the length of the other two sides$\geq 1.5$). By using a foreign object having such a shape, it becomes possible to control the state of the short-circuit with high accuracy.

In the first evaluation method of the present invention, a second method for causing a short-circuit may be preferably used instead of the first short-circuit causing method. In the second short-circuit causing method, for example, a short-circuit is caused by placing a shape memory alloy or bimetal at a location inside the electrode group of the battery where the positive electrode and the negative electrode are opposed to each other, and changing temperature to deform the shape memory alloy or bimetal and locally crush the insulating layer. The second short-circuit causing method can also cause a short-circuit at a desired location inside a battery.

When a shape memory alloy is used, for example, a shape memory alloy that remembers a curved or a polygonal shape may be deformed into a linear shape and placed between the electrodes. In this state, the temperature is changed to a temperature at which the shape memory alloy regains the shape it remembers. Then, it deforms into a curved or a polygonal shape, thereby crushing the insulating layer to cause a short-circuit. Also, when a bimetal is used, for example, a linear bimetal may be placed between the electrodes. In this state, the temperature is changed to a temperature at which the bimetal deforms due to a difference in expansion rate. Then, the bimetal deforms, thereby crushing the insulating layer to cause a short-circuit. Preferably, the shape memory alloy and bimetal change in shape at 80° C. or less at which there is no adverse effect on battery characteristics.

In the first evaluation method of the present invention, a third method for causing a short-circuit may be preferably used instead of the first short-circuit causing method. In the third short-circuit causing method, for example, a short-circuit is caused by cutting out a certain area of the insulating layer of the battery where the positive electrode and the negative electrode are opposed to each other, and applying a pressure to the cut area. The third short-circuit causing method can also cause a short-circuit at a desired location inside a battery. In the third short-circuit causing method, the part of the insulating layer to be cut and the short-circuit area can be freely determined, and further, the area is always constant. It therefore becomes possible to control the state of the short-circuit with high accuracy and evaluate the safety under an internal short-circuit condition accurately.

With respect to the method for cutting the insulating layer, the insulating layer may be cut before the electrode group is assembled. Alternatively, after the finished battery is disassembled and the electrode group is taken out of the housing, the insulating layer inside the electrode group may be cut, followed by reassembling. Further, it is preferable to cut the insulating layer, place an insulating sheet over the cut area of the insulating layer, reassembling the battery or electrode group therewith, pulling out the insulating sheet from the battery or electrode group, and applying a pressure to the cut area. In this case, it is possible to prevent a short-circuit during the assembling after the cutting.

Also, another example of the evaluation method of the present invention is a second evaluation method. The second evaluation method is characterized in that the battery is a lithium secondary battery including a positive electrode that has an exposed part of a current-collecting terminal at an outermost part, that a pressing member with a sharp edge is stuck into the battery, and that the pressing member is stuck first with ultrasonic waves being applied and then with the application of the ultrasonic waves being stopped. When a pressing member is stuck into a battery including a positive electrode that has an exposed part of a current-collecting terminal at an outermost part from outside, as in a conventional nail penetration test, a short-circuit occurs first between the current-collecting terminal of the positive electrode and a negative electrode. As described above, since a positive electrode current-collecting terminal (usually Al) has a significantly lower resistance than a positive electrode active material, most of the short-circuit current flows between the positive electrode current-collecting terminal and a negative electrode, and Joule's heat due to the short-circuit is generated at the exposed part of the current-collecting terminal, not at the positive electrode active material part having low thermal stability. It is thus not possible to accurately evaluate the safety under an internal short-circuit condition.

Contrary to this, in the second evaluation method, since the pressing member is stuck into the electrode group with ultrasonic waves being applied, a continuing short-circuit does not occur. Hence, by sticking the pressing member with ultrasonic waves being applied and sticking it with the application of the ultrasonic waves being stopped, a short-circuit can be caused at a desired location of the battery. For example, by sticking the pressing member into a desired location inside the electrode group with ultrasonic waves being applied and then further sticking the pressing member a given distance with the application of the ultrasonic waves being stopped, it is possible to freely select a location at which an internal short-circuit is caused. With respect to the frequency f of the ultrasonic waves, it is preferable that $20 \text{ kHz} \leq f \leq 100 \text{ kHz}$.

In a preferable method for causing an internal short-circuit in the second evaluation method, the battery is a lithium secondary battery including a positive electrode that has an exposed part of a current-collecting terminal at an outermost part, and a short-circuit is caused by sticking a pressing member with a sharp edge into the battery until the pressing member reaches the exposed part of the current-collecting terminal, with ultrasonic waves being applied, and then further inserting the pressing member into the battery, with the application of the ultrasonic waves being stopped.

Also, another example of the evaluation method of the present invention is a third evaluation method. The third evaluation method is characterized in that the battery is a lithium secondary battery including a positive electrode that has an exposed part of a current-collecting terminal at an outermost part, that the exposed part of the current-collecting terminal of the positive electrode is cut out without causing a continuing short-circuit, and that a pressing member with a sharp edge is stuck into the cut part (cut area). In this case, a short-circuit can be caused at a desired location of the battery without being affected by the current-collecting terminal of the positive electrode. The method for cutting the exposed part of the positive electrode current-collecting terminal is preferably a method that uses a tool capable of cutting with ultrasonic waves being applied, such as an ultrasonic cutter. In this case, it is possible to cut out the exposed part of the positive electrode current-collecting terminal without causing a continuing short-circuit.

Also, another example of the evaluation method of the present invention is a fourth evaluation method. The fourth evaluation method is characterized in that the battery is a wound-type battery including a wound electrode group, and that a pressing member with a sharp edge is stuck into the bottom of the battery. This can also cause a short-circuit at a desired location inside the battery. In the case of conventional nail penetration tests, the test results vary greatly depending on the constitution of the outermost part of the battery, as described above. However, by short-circuiting the bottom of the wound-type battery, it is possible to evaluate the safety of the battery under an internal short-circuit condition without being affected by the constitution of the outermost part. In this method, also, the pressing member is stuck in the direction parallel to the electrode surface. Also, this method allows very easy evaluation without applying any special process to the battery.

Also, another example of the evaluation method of the present invention is a fifth evaluation method. The fifth evaluation method is characterized in that the battery includes a laminated electrode group, and that a pressing member with a sharp edge is stuck into a side face of the battery, i.e., in the direction parallel to the electrode surface. In the case of laminated batteries, when a nail is stuck in the direction perpendicular to the electrode surface, there is a large influence by the constitution of the outermost part. Hence, by sticking the pressing member into the side face of the battery, i.e., in the direction parallel to the electrode surface, a desired location inside the battery can be short-circuited and the safety of the battery under an internal short-circuit condition can be evaluated without being affected by the constitution of the battery.

Also, another example of the evaluation method of the present invention is a sixth evaluation method. The sixth evaluation method is characterized in that the battery is a wound-type battery, and that a pressing member with a sharp edge is stuck into a substantially central part of the bottom of the battery slantwise relative to the winding axis of the electrode group. According to this method, a short-circuit can be caused at a desired location inside the battery, particularly at an innermost part of the electrodes, and the safety of the battery under an internal short-circuit condition can be evaluated without being greatly affected by the radiation of heat.

Also, another example of the evaluation method of the present invention is a seventh evaluation method. The seventh evaluation method is characterized in that at least part of the outer part of the battery is heated to a temperature equal to or higher than the melting point of the insulating layer to locally melt the insulating layer. By this, a desired location inside the battery can be short-circuited. In this case, the location at which a short-circuit occurs can be defined by selecting a part to be heated.

Examples of the method for heating the battery include a method of irradiating the battery with a laser, and a method of bringing a heat generator having a temperature equal to or higher than the melting point of the insulating layer close to the battery. Among them, the method of bringing the heat generator to the battery is preferred. The heat generator is preferably a soldering iron. The temperature of heat generated by a soldering iron is about 350° C., which is higher than the melting point of polyolefin commonly used as the insulating layer, and the temperature is stable. Also, the shape at the edge thereof is narrow. It is thus possible to define the location of a short-circuit with good accuracy.

The outer part of the battery heated to a temperature equal to or higher than the melting point of the insulating layer is preferably a connection area between the housing and the current-collecting terminal. When this area is heated, heat is efficiently conducted through the current-collecting terminal. It is thus possible to cause a short-circuit in a more reliable manner while reducing the influence by the radiation of heat on the housing surface.

It is also possible to take the electrode group out of the housing of the battery and heat the electrode group. This can also cause a short-circuit at a desired location. Further, when the battery is a lithium secondary battery including a positive electrode that has an exposed part of a current-collecting terminal at an outermost part, heating may be performed after taking the electrode group out of the housing of the battery and cutting out the exposed part of the current-collecting terminal. In this case, safety can be evaluated more accurately while eliminating the influence by the short-circuit between the positive electrode current-collecting terminal and the negative electrode, which is preferable.

Also, it is preferable to produce batteries by using a production method of batteries whose safety level about internal short-circuits has been specified by the evaluation method of the present invention. Specifically, it is preferable to identify the safety levels of batteries by the evaluation method of the present invention, select a battery having a desired safety level, and produce batteries according to the method by which the selected battery was produced. By producing batteries by the same production method, the same internal short-circuit safety level can be assured. Also, batteries produced by the production method of batteries whose safety level about internal short-circuits has been specified by the evaluation method of the present invention are preferable because they have almost the same internal short-circuit safety level.

Further, it is preferable to produce battery packs by using a production method of battery packs whose safety level about internal short-circuits has been specified by the evaluation method of the present invention. Specifically, it is preferable to identify the safety levels of batteries by the evaluation method of the present invention, select a battery pack having a desired safety level, and produce battery packs according to the method by which the selected battery pack was produced. By producing battery packs by the same production method, the same internal short-circuit safety level can be assured. Also, battery packs produced by the production method of battery packs whose safety level about internal short-circuits has been specified by the evaluation method of the present invention are preferable because they have almost the same internal short-circuit safety level.

Next, an evaluation device for safety upon battery internal short circuit according to the present invention (hereinafter referred to as "evaluation device") is described. The evaluation device of the present invention is a device capable of causing a short-circuit at a desired location of a battery and evaluating the safety of the battery under the internal short-circuit condition, as described above. FIG. 1 is a block diagram showing the structure of an evaluation device 1 in one embodiment of the present invention. It should be noted that the following embodiment is an example of the evaluation device of the present invention and is not construed as limiting the technical range of the present invention.

The evaluation device 1 of the present invention includes a pressure applying section 2, a pressure controlling section 3, a battery information measuring section 4, a short-circuit detecting section 5, and a section 6 for detecting the height position of the pressure applying section. The pressure applying section 2, the pressure controlling section 3, the battery information measuring section 4, the short-circuit detecting section 5, and the pressure-applying-section height-position detecting section 6 are electrically connected, for example, as illustrated in FIG. 1.

The pressure applying section 2 is provided for forcedly causing a short-circuit in a battery. For example, a pressure applying device is used as the pressure applying section 2. The pressure applying device is not particularly limited if it is capable of applying a pressure to a battery. Examples which may be used include pressure applying devices of screw type using a servomotor, post guide screw type, pendulum type, lever type, crank type, mechanical press type, hydraulic press type, and air press type. The tip of the pressure applying device is equipped with a member such as a round bar, square bar, flat plate, or nail. This member is driven into a test battery 100 which has been subjected to a process, such as placement of a foreign object or cutting of the insulating layer, in order to apply a pressure. For example, when the tip of the pressure applying device is equipped with a nail, an internal short-circuit test can be performed by sticking the tip of the nail into the battery. Also, when the tip of the pressure applying device is equipped with a round bar, square bar, flat plate, or the like, an internal short-circuit test can be performed by crushing the battery to cause a short-circuit between the positive electrode and the negative electrode inside the battery. A battery placement table, not shown, is disposed at a location near the pressure applying section 2 to which the pressure applying section 2 can apply a pressure, and the test battery 100 is placed thereon.

The pressure controlling section 3 adjusts the pressure applied by the pressure applying section 2 and stops the application of the pressure, while receiving the detection result of the position of the pressure applying section 2 by the pressure-applying-section height-position detecting section 6. The pressure controlling section 3 is mainly controlled by the control signal sent from the short-circuit detecting section 5 which will be described later. For example, when the pressure controlling section 3 receives from the short-circuit detecting section 5 a control signal that requests that the application of the pressure be stopped due to the occurrence of a short-circuit, it stops the application of the pressure by the pressure applying section 2. When the pressure controlling section 3 receives the control signal from the short-circuit detecting section 5, it may stop the application of the pressure by the pressure applying section 2 after allowing the application of the pressure to continue until a certain depth is reached, depending on the detection result by the pressure-applying-section height-position detecting section 6. Further, the pressure controlling section 3 may have the function of transferring the detection result by the pressure-applying-section height-position detecting section 6 to the short-circuit detecting section 5. In this case, the short-circuit detecting section 5 maybe configured to detect the occurrence of a short-circuit and control the application of the pressure until a certain depth is reached after the detection.

The battery information measuring section 4, for example, measures the battery information of the test battery 100 that is under pressure by the pressure applying section 2 and sends the measurement result to the short-circuit detecting part 4. Examples of battery information include battery voltage, battery temperature, and pressure inside the battery. In particular, battery voltage changes sensitively when an internal short-circuit occurs, and it is thus preferable as battery information for detecting an internal short-circuit.

The short-circuit detecting section 5 is a circuit including a short-circuit detecting section and a control section. The circuit may be, for example, a process circuit including a micro computer with a central processing unit (CPU), a memory, and the like.

The short-circuit detecting section detects the presence or absence of an internal short-circuit, for example, by comparing the measurement result sent from the battery information measuring section 4 with a reference value of each battery information item to make a determination. The reference value is a value for determining the presence or absence of a short-circuit. When the value of a battery information item is different from a reference value, it is determined that an internal short-circuit has occurred. For example, the reference value of each battery information item is stored in a memory in advance and read from the memory to make a comparison and determination. A known memory device can be used as the memory, and examples include read only memory (ROM), random access memory (RAM), and hard disk drive (HDD). When the short-circuit detecting section detects the occurrence of an internal short-circuit, it sends a detection signal to the control section. It should be noted that one or more short-circuit detecting sections may be provided. For example, a short-circuit detecting section may be provided for each of battery information items. Alternatively, with the order of priority assigned to battery information items, one short-circuit detecting section may be used to make a comparison and determine the presence or absence of an internal short-circuit.

The control section includes a control circuit that sends a control signal depending on the detection signal from the short-circuit detecting section and a controller that detects the control signal from the control circuit. Alternatively, the control section may include only the control circuit. For example, when the control section receives a detection signal of an internal short-circuit from the short-circuit detecting section, it sends a control signal to the pressure controlling section 3. Upon receiving the signal, the pressure controlling section 3 stops the application of the pressure to terminate the evaluation. It should be noted that the control signal is sent at a given time relative to the time of detection of the occurrence of an internal short-circuit. The control section may send a control signal immediately after receiving the detection signal from the short-circuit detecting section. Also, it may send a control signal after a given time lag by using a timer. When the control section receives a detection result of the positional information of the pressure applying section 2 from the pressure-applying-section height-position detecting section 6, that is described below, via the pressure controlling section 3, it may allow the application of the pressure to continue until a certain depth is reached after the detection of a short-circuit, and then send a control signal to the pressure controlling section 3 to stop the pressure applying section 2.

The pressure-applying-section height-position detecting section 6 detects positional information of the pressure applying section 2 and sends the detection result to the pressure controlling section 3. Also, it may send the detection result directly to the short-circuit detecting section 5.

In the evaluation device 1 of the present invention, for example, the test battery 100 is placed at a predetermined position, and a pressure is applied to the test battery 100 when the control section of the short-circuit detecting section 5 sends a control signal to the pressure controlling section 3 to actuate the pressure applying section 2. During the pressure application, battery information is measured by the battery information measuring section 4, and the measurement result is sent to the short-circuit detecting section 5. The short-circuit detecting section 5 compares the measurement result by the battery information measuring section 4 with a reference value to detect the presence or absence of an internal short-circuit. When the short-circuit detecting section 5 detects the occurrence of an internal short-circuit, it sends a control signal to the pressure controlling section 3 to stop the application of the pressure by the pressure applying section 2. In this way, the occurrence of a short-circuit is detected and the safety of a battery can be accurately evaluated.

With respect to evaluation criteria of battery safety in this short-circuit evaluation method, the amount of an increase in battery temperature may be evaluated by using a thermocouple, a thermoviewer, etc., or the amount of heat generated may be measured by using a calorimeter, etc. Such devices may be included in the battery information measuring section 4.

Figure 2:
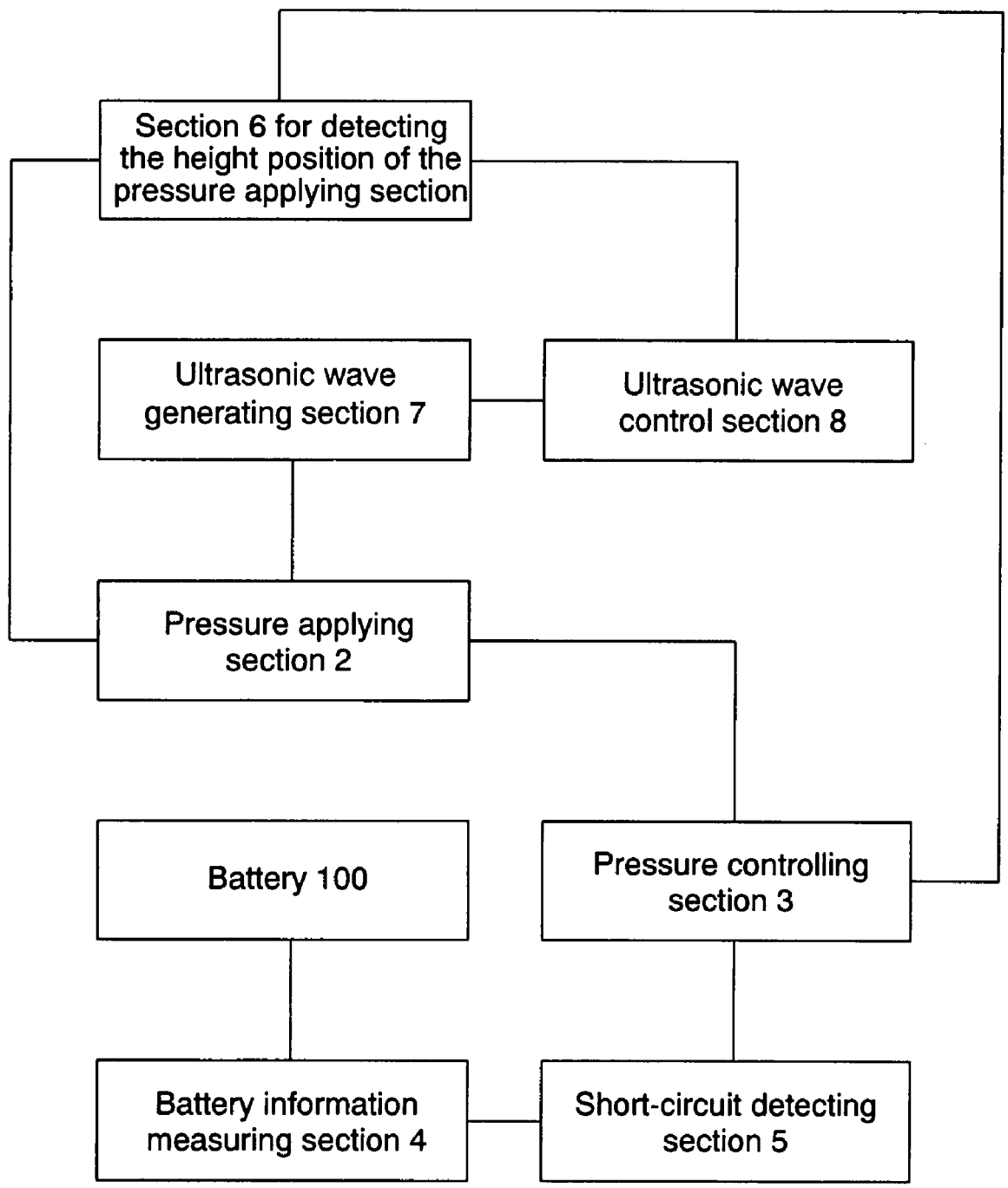
FIG. 2 is a block diagram showing the structure of an evaluation device for safety upon battery internal short circuit in an embodiment of the present invention.

FIG. 2 is a block diagram showing the structure of an evaluation device 1a in another embodiment of the present invention. The evaluation device 1a is similar to the evaluation device 1 and the components equivalent thereto are thus given the same reference characters without providing explanation. The evaluation device 1a is characterized by including an ultrasonic wave generating section 7 and an ultrasonic wave control section 8, and the other components thereof are the same as those of the evaluation device 1.

The ultrasonic wave generating section 7 produces ultrasonic waves and applies the ultrasonic waves to the pressure applying section 2. To start an evaluation, first, the ultrasonic wave control section 8 actuates the ultrasonic wave generating section 7 to apply ultrasonic waves to the pressure applying section 2. Subsequently, while the pressure controlling section 3 receives a signal from the pressure-applying-section height-position detecting section 6, it lowers the pressure applying section 2 to a predetermined depth, so that the pressure applying section 2 is inserted into a battery without causing a continuing short-circuit. Then, the ultrasonic waves are stopped. Thereafter, the pressure controlling section 3 further lowers the pressure applying section 2 as described above to cause an internal short-circuit in the battery.

As described above, by using the evaluation device 1 and 1a of the present invention, the safety of a battery under an internal short-circuit condition can be accurately evaluated.

Also, it is preferable to produce batteries by using a production method of batteries whose safety level about internal short-circuits has been specified by the above-mentioned internal short-circuit evaluation device. By producing batteries by the same production method, the same internal short-circuit safety level can be assured.

Further, it is preferable to produce battery packs by using a production method of battery packs whose safety level about internal short-circuits has been specified by the above-mentioned internal short-circuit evaluation device. By producing battery packs by the same production method, the same internal short-circuit safety level can be assured.

Also, batteries are preferably produced by the above-mentioned production method. In this case, the same battery internal short-circuit safety level can be assured.

Further, battery packs are preferably produced by the above-mentioned production method. In this case, the same battery pack internal short-circuit safety level can be assured.

The above-described battery evaluation device of the present invention are applicable, for example, to primary batteries such as manganese dry batteries, alkaline dry batteries, and lithium primary batteries, and secondary batteries such as lead-acid batteries, nickel cadmium storage batteries, nickel metal-hydride batteries, and lithium secondary batteries, without being limited to specific battery types.

The method for evaluating an internal short-circuit of a battery according to the present invention is hereinafter described specifically by way of Examples.

EXAMPLE 1

<Production of Battery>

A cylindrical lithium secondary battery was produced in the following manner as a battery to be subjected to a safety evaluation under an internal short-circuit condition.

(i) Preparation of Positive Electrode

A positive electrode mixture paste was prepared by stirring 3 kg of nickel manganese cobalt lithium oxide ($LiNi_{1/3}Mn_{1/3}Co_{1/3}O_2$) powder (median diameter 15 µm) serving as a positive electrode active material, 1 kg of N-methyl-2-pyrrolidone (hereinafter "NMP") solution (trade name: #1320, available from Kureha Corporation) containing 12% by weight of polyvinylidene fluoride (hereinafter "PVDF") binder, 90 g of acetylene black conductive agent, and a suitable amount of NMP dispersion medium with a double-arm kneader. The positive electrode mixture paste was applied onto both sides of a belt-like positive electrode current-collecting terminal made of a 20-µm-thick aluminum foil. The applied positive electrode mixture paste was dried and rolled with reduction rolls to form positive electrode active material layers, so that the thickness of the active material layer formed was 180 µm. The electrode obtained was cut to a width (56 mm) such that it was capable of being inserted into a cylindrical housing (diameter 18 mm, height 65 mm, internal diameter 17.85 mm). In this way, a positive electrode was obtained.

It should be noted that the part of the current-collecting terminal corresponding to the innermost part of the electrode group was provided with an exposed part, to which an aluminum connection terminal was welded.

(ii) Preparation of Negative Electrode A

A negative electrode mixture paste was prepared by stirring 3 kg of artificial graphite powder (median diameter 20 µm) serving as a negative electrode active material, 75 g of an aqueous dispersion (trade name: BM-400B, available from Zeon Corporation) containing 40% by weight of modified styrene butadiene rubber particle binder, 30 g of carboxymethyl cellulose (CMC) thickener, and a suitable amount of water serving as a dispersion medium with a double-arm kneader. The negative electrode mixture paste was applied onto both sides of a belt-like negative electrode current-collecting terminal made of a 20-µm-thick copper foil. The applied negative electrode mixture paste was dried and rolled with reduction rolls to form negative electrode active material layers, so that the thickness of the active material layer formed was 180 µm. The electrode obtained was cut to a width (57.5 mm) such that it was capable of being inserted into the housing. In this way, a negative electrode was obtained. It should be noted that the part of the current-collecting terminal corresponding to the outermost part of the electrode group was provided with an exposed part having a length of about one turn, and a nickel connection terminal was welded to the end thereof. This was designated as a negative electrode plate A.

(iii) Production of Negative Electrode B

Also, a porous heat-resistant layer was formed on the whole surface of the negative electrode active material layer of the negative electrode A in the following manner. A paste for forming a porous heat-resistant layer was prepared by stirring 970 g of alumina with a median diameter of 0.3 μm (insulating filler), 375 g of NMP solution (trade name: BM-720H, available from Zeon Corporation) containing 8% by weight of modified polyacrylonitrile rubber (binder), and a suitable amount of NMP with a double-arm kneader. This paste was applied onto the surface of the negative electrode active material layer and dried at 120° C. in a vacuum for 10 hours to form a porous heat-resistant layer with a thickness of 0.5 μm. The porosity of the porous heat-resistant layer was 48%. The porosity was calculated from the thickness of the porous heat-resistant layer as determined by taking an SEM photo of its cross-section, the amount of alumina present in the porous heat-resistant layer per unit area as determined by fluorescence X-ray analysis, the true specific gravities of alumina and the binder, and the weight ratio of alumina to the binder. The negative electrode plate produced in the above manner was designated as a negative electrode plate B.

(iv) Fabrication of Battery

The positive electrode and the negative electrode were wound together with a 20-μm-thick polyethylene insulating layer (trade name: Hipore, available from Asahi Kasei Corporation) interposed therebetween, to form an electrode group. The electrode group was inserted into a nickel-plated iron cylindrical housing (diameter 18 mm, height 65 mm, internal diameter 17.85 mm), and 5.0 g of an electrolyte was injected into the housing. The opening of the housing was sealed with a cover, to complete a lithium secondary battery with a capacity of 2400 mAh. The electrolyte used was prepared by dissolving $LiPF_6$ at a concentration of 1 mol/L in a solvent mixture of ethylene carbonate (EC), dimethyl carbonate (DMC), and ethyl methyl carbonate (EMC). The volume ratio of EC/DMC/EMC in the solvent mixture was 1:1:1. To the electrolyte was added 3% by weight of vinylene carbonate (VC).

In the manner as described above, 20 batteries were produced and evaluated as follows.

First, they were preliminarily charged and discharged twice and then charged to 4.1 V at a current value of 400 mA. Subsequently, they were stored in an environment at 45° C. for 7 days. Thereafter, they were charged under the following conditions, and the safety of these batteries under an internal short-circuit condition was evaluated.

Constant current charge: current value 1500 mA/end-of-charge voltage 4.25 V

Constant voltage charge: charge voltage 4.25 V/end of charge current 100 mA

The battery produced in the above manner by using the negative electrode plate A was designated as a battery A, and the battery produced in the above manner by using the negative electrode plate B was designated as a battery B. The batteries produced were evaluated as follows.

(Evaluation of Internal Short-Circuit Safety)

Figure 3:
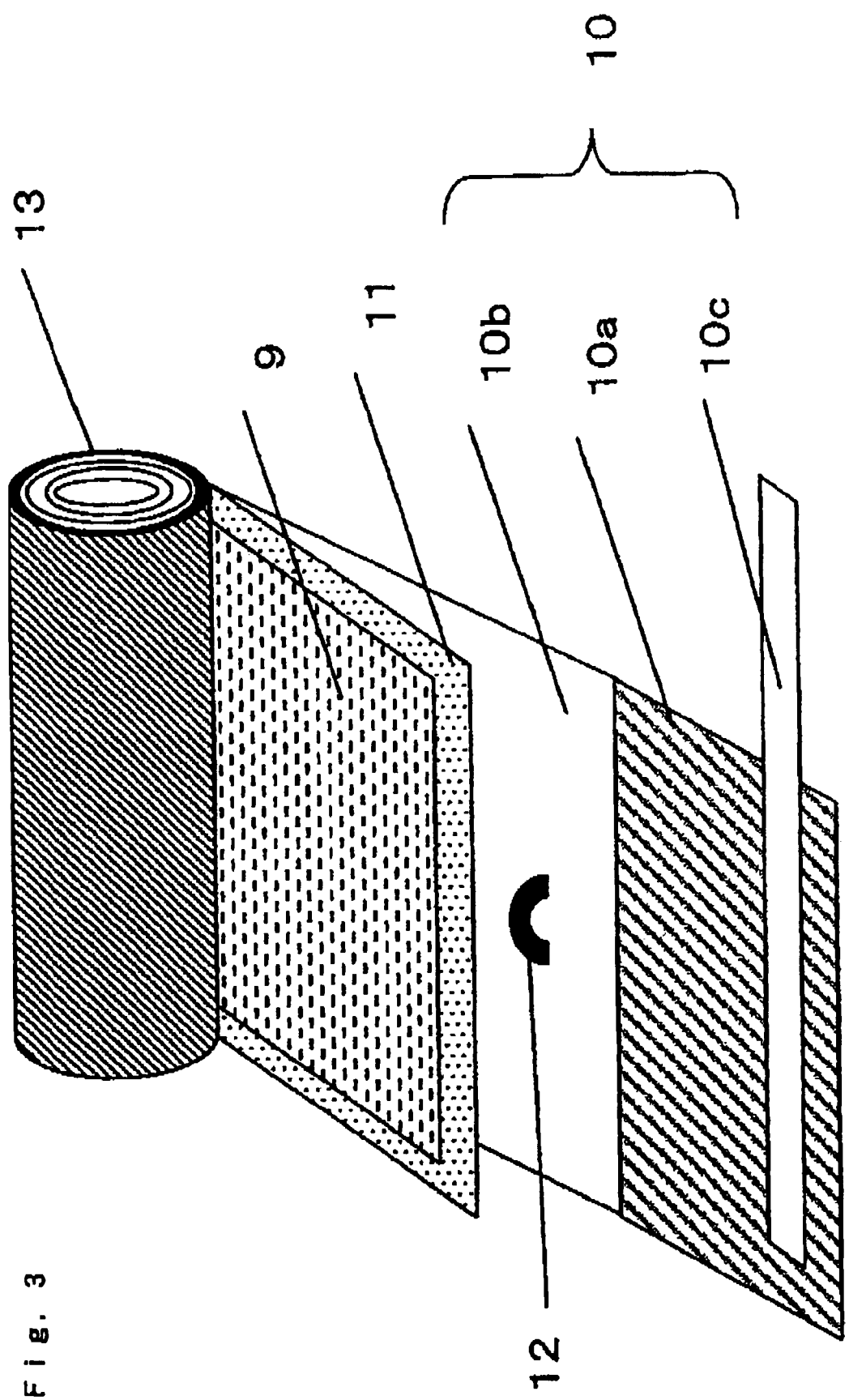
FIG. 3 is a perspective view which is intended to describe a method for evaluating an internal short-circuit of a battery in Example 1.

The charged battery A was disassembled in a dry environment and the electrode group was taken out. The outermost part thereof was unwound a little. A horseshoe-shaped Ni plate with a width of 200 μm, a thickness of 300 μm, and a length of 3 mm was placed between the negative electrode and the insulating layer where the positive electrode active material layer and the negative electrode active material layer were opposed to each other. At this time, the length in the direction perpendicular to the electrode surface (height) is 200 μm. FIG. 3 is a schematic view of the electrode group. In FIG. 3, reference number 9 represents the positive electrode. Also, reference number 10 represents the negative electrode, which includes a negative electrode active material 10a, an exposed part of a negative electrode current-collecting terminal 10b, and a negative electrode connection terminal 10c. Further, reference number 11 represents the insulating layer, 12 represents the foreign object, and 13 represents the electrode group.

Thereafter, the electrode group was wound again, sealed, placed in a constant temperature oven at 60° C., and kept until the battery temperature reached 60° C. Then, a pressure was applied to the electrode group by using a dome-shaped pressing member of ϕ 6 mm. With respect to the pressure application conditions, the speed was set constant at 1 mm/s and the maximum pressure was set to 50 kg/cm$^2$. At the instant when the battery voltage reached 4.0 V or less due to a short-circuit, the short-circuit was stopped. Besides the measurement of the battery voltage, the battery surface was measured with a thermocouple, and the amount of battery temperature increase (° C.) in 5 seconds after the occurrence of the short-circuit was evaluated in terms of the average value. Also, 10 batteries were measured in the same manner, and the standard deviation of battery temperature increase was obtained.

EXAMPLE 2

A battery was produced in the same manner as in Example 1, except that the outermost part of the positive electrode current-collecting terminal of the battery was provided with an exposed part having a length of about one turn, and evaluated in the same manner. This is Example 2.

Comparative Example 1

A battery A was produced in the same manner as in Example 1 and evaluated as follows. This is Comparative Example 1. The battery was charged to 4.25 V, placed in a 60° C. constant temperature oven without disassembling, and kept until the battery temperature reached 60° C. An iron nail (ϕ 3 mm) was used as the pressing member and stuck into the electrode group. With respect to the pressure application conditions, the speed was set constant at 1 mm/s and the maximum pressure was set to 200 kg/cm$^2$. After the battery voltage reached 4.0 V or less due to a short-circuit, the nail was further stuck 200 μm and stopped. Besides the measurement of the battery voltage, the battery surface was measured with a thermocouple, and the amount of battery temperature increase in 5 seconds after the occurrence of the short-circuit was evaluated in terms of the average value. Also, 10 batteries were measured in the same manner, and the standard deviation of battery temperature increase was obtained.

Comparative Example 2

A battery A was produced in the same manner as in Example 2 and evaluated as follows. This is Comparative Example 2. The battery was charged to 4.25 V, placed in a 60° C. constant temperature oven without disassembling, and kept until the battery temperature reached 60° C. An iron nail (φ 3 mm) was used as the pressing member and stuck into the electrode group. With respect to the pressure application conditions, the speed was set constant at 1 mm/s and the maximum pressure was set to 200 kg/cm². After the battery voltage reached 4.0 V or less due to a short-circuit, the nail was further stuck 200 μm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

EXAMPLE 3

A battery A was produced in the same manner as in Example 2 except that the height of the foreign object placed in the electrode group was changed to 50 μm, and evaluated in the same manner as in Example 2. This is Example 3.

EXAMPLE 4

A battery A was produced in the same manner as in Example 2 except that the height of the foreign object placed in the electrode group was changed to 500 μm, and evaluated in the same manner as in Example 2. This is Example 4.

Table 1 shows the evaluation results of Examples 1 to 4 and Comparative Examples 1 and 2.

TABLE 1

| | Evaluation method of internal short-circuit | Exposed part of outermost positive electrode current-collecting terminal | Height of Foreign object* (μm) | Amount of battery temperature increase | |
|---|---|---|---|---|---|
| | | | | Average (° C.) | Standard deviation |
| Example 1 | Placement of foreign object | Absent | 200 | 36 | 1.82 |
| Example 2 | Placement of foreign object | Present | 200 | 35 | 2.03 |
| Comparative Example 1 | Nail penetration | Absent | 200 | 41 | 1.83 |
| Comparative Example 2 | Nail penetration | Present | 200 | 12 | 1.35 |
| Example 3 | Placement of foreign object | Present | 50 | 2 | 0.95 |
| Example 4 | Placement of foreign object | Present | 500 | 39 | 6.88 |

*Depth of short-curcuit in the case of nail penetration

In Example 1 and Example 2 where the internal short-circuit was caused by placing the foreign object into the electrode group and applying the pressure, their batteries exhibited similar temperature increases irrespective of the constitution of the outermost part of the battery. Also, they exhibited small variations in measurement. On the other hand, in Comparative Examples 1 and 2 where the short-circuit was caused by sticking the nail from outside the battery, the variation in battery temperature increase was small, but there was a significantly large difference in battery temperature increase after the short-circuit between the presence and the absence of exposure of the outermost positive electrode current-collecting terminal. In particular, in Comparative Example 2 where the positive electrode current-collecting terminal was provided with the exposed part, the battery temperature increase was significantly small in comparison with the cases where the short-circuit was caused by placing the foreign object. This clearly indicates that the internal short-circuit evaluation method by nail penetration may overestimate safety depending on the local constitution of the battery. On the other hand, the evaluation method by foreign object placement can accurately estimate the safety under an internal short-circuit condition without being affected by the local constitution of the battery.

Also, in Example 3 where the height of the foreign object placed was 50 μm, there was a small variation in evaluation results, but the battery temperature increase was smaller than in Example 1. In Example 3, the height of the foreign object is less than the sum of the thickness of the insulating layer (20 μm) and the thickness of the positive electrode active material (80 μm). It is thus believed that the short-circuit occurred between the positive electrode active material and the negative electrode active material having significantly higher resistance than the current-collecting terminal, so that the Joule's heat produced was small, thereby resulting in the small battery temperature increase. In fact, when the batteries of Example 1 and Example 2 after the evaluation were disassembled, it was confirmed that in the battery of Example 1, the nickel foreign object reached the positive electrode current-collecting terminal, and that in the battery of Example 2, the nickel foreign object did not reach the positive electrode current-collecting terminal. This indicates that when the height of the foreign object placed is too low, the safety may be overestimated, and that the preferable height of the conductive foreign object is at least the sum (100 μm) of the thickness (20 μm) of the insulating layer and the thickness of the positive electrode active material (80 μm).

Also, in Example 4 in which the height of the conductive foreign object placed was 500 μm, there was a large variation in evaluation results. This is probably because the height of the foreign object is greater than the sum (400 μm) of the thickness (180 μm) of active material of the positive electrode plate, the thickness (180 μm) of active material of the negative electrode plate, and the double (40 μm) of the thickness (20 μm) of the insulating layer. Hence, it is believed that a short-circuit through two layers occurred in some of the batteries, thereby resulting in a variation in the amount of heat produced. In fact, when the batteries after the evaluation were disassembled, it was confirmed that a short-circuit through two layers occurred in 3 batteries out of 10 batteries.

EXAMPLE 5

A battery A was produced in the same manner as in Example 2 and evaluated in the same manner as in Example 2 except that the pressure application condition was changed to a constant pressure of 10 kg/cm². This is Example 5.

EXAMPLE 6

A battery A was produced in the same manner as in Example 2 and evaluated in the same manner as in Example 2 except that the pressure application condition was changed to a constant pressure of 50 kg/cm². This is Example 6.

EXAMPLE 7

A battery A was produced in the same manner as in Example 2 and evaluated in the same manner as in Example 2 except that the pressure application condition was changed to a constant pressure of 500 kg/cm². This is Example 7.

Table 2 shows the evaluation results of Examples 5 to 7.

A battery A was produced in the same manner as in Example 2 and evaluated in the same manner as in Example 2 except that the pressure application condition was changed to a constant pressure of 500 kg/cm². This is Example 7.

Table 2 shows the evaluation results of Examples 5 to 7.

TABLE 2

| Example | Evaluation method of internal short-circuit | Exposed part of outermost positive electrode current-collecting terminal | Height of foreign object (μm) | Pressure applied (kg/cm²) | Battery temperature increase Average (° C.) | Standard deviation |
|---|---|---|---|---|---|---|
| 5 | Placement of foreign object | Present | 200 | 10 | 37 | 1.91 |
| 6 | Placement of foreign object | Present | 200 | 50 | 36 | 1.78 |
| 7 | Placement of foreign object | Present | 500 | 500 | 42 | 5.36 |

EXAMPLE 8

Figure 4:
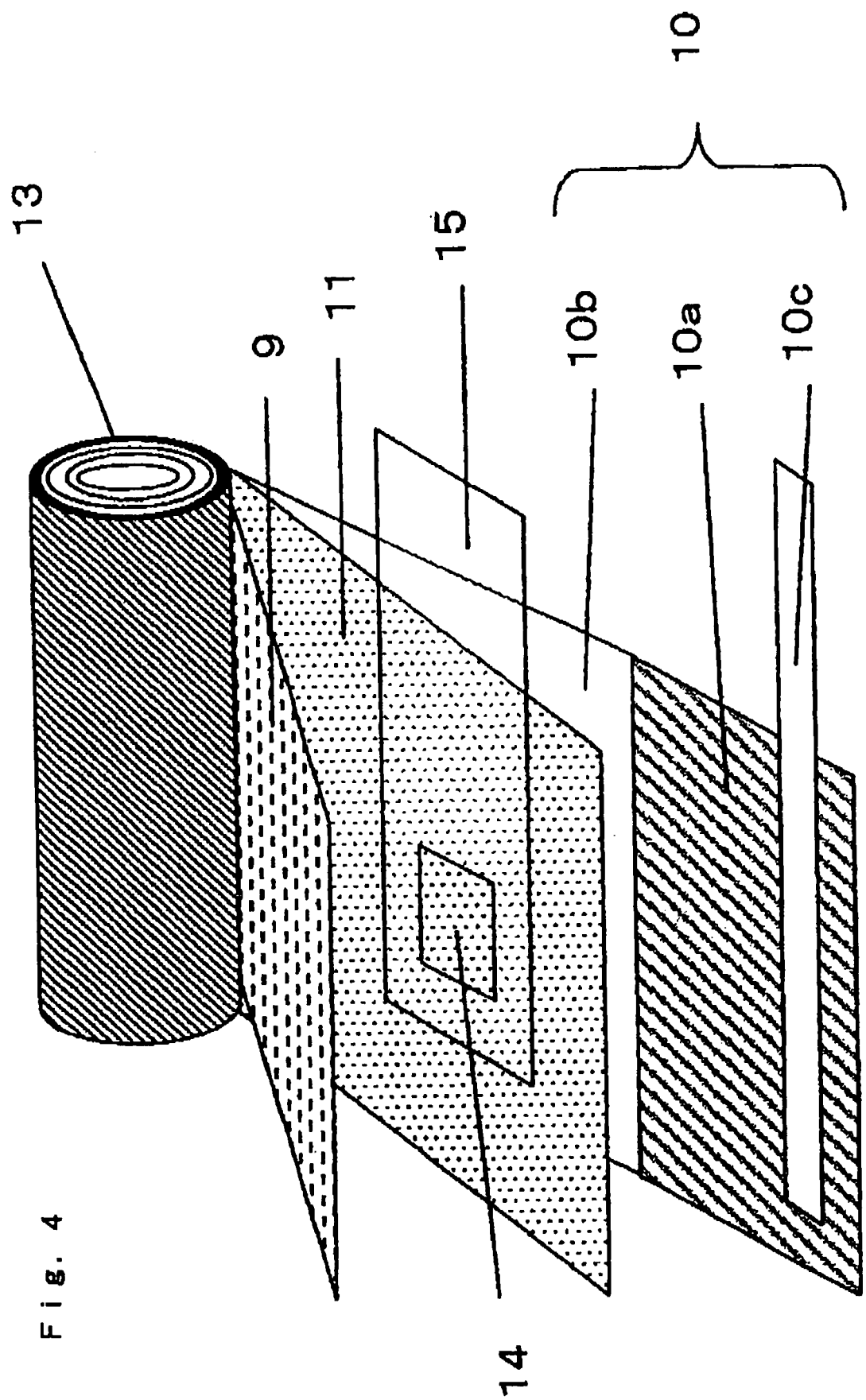
FIG. 4 is a perspective view which is intended to describe a method for evaluating an internal short-circuit of a battery in Example 8.

A battery A was produced in the same manner as in Example 1 and evaluated as follows. The charged battery was disassembled in a dry environment and the electrode group was taken out. The outermost part thereof was unwound a little. At a location where the positive electrode active material layer and the negative electrode active material layer were opposed to each other, a part of the insulating layer in the center of the width direction was cut out in the shape of a square of 1 cm×1 cm. Subsequently, a 40-μm-thick PET sheet of 2 cm×8 cm was placed over the cut part such that its end protruded in the width direction of the electrode group. FIG. 4 is a schematic view of the electrode group. In FIG. 4, reference number 14 represents the cut part of the insulating layer and reference number 15 represents the PET sheet. The other components are the same as those in FIG. 3.

Thereafter, the electrode group was wound again, sealed, placed in a 60° C. constant temperature oven, and kept until the battery temperature reached 60° C. The PET sheet was taken out and a pressure was applied to the electrode group by using a pressing member of a 1.5-cm square. With respect to the pressure application conditions, the speed was set constant at 1 mm/s and the maximum pressure was set to 50 kg/cm². At the instant when the battery voltage reached 4.0 V or less due to a short-circuit, the short-circuit was stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained. This is Example 8.

EXAMPLE 9

A battery A was produced in the same manner as in Example 2 and evaluated as follows. The charged battery was disassembled in a dry environment and the electrode group was taken out. The outermost part thereof was unwound a little. At a location where the positive electrode active material layer and the negative electrode active material layer were opposed to each other, a part of the insulating layer in the center of the width direction was cut out in the shape of a square of 1 cm×1 cm. Subsequently, a 40-μm-thick PET sheet of 2 cm×8 cm was placed over the cut part such that its end protruded in the width direction of the electrode group. FIG. 4 is a schematic view of the electrode group. Thereafter, the electrode group was wound again, sealed, placed in a 60° C. constant temperature oven, and kept until the battery temperature reached 60° C. The PET sheet was taken out and a pressure was applied to the electrode group by using a pressing member of a 1.5-cm square. With respect to the pressure application conditions, the speed was set constant at 1 mm/s and the maximum pressure was set to 50 kg/cm². At the instant when the battery voltage reached 4.0 V or less due to a short-circuit, the short-circuit was stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained. This is Example 9.

EXAMPLE 10

A battery A was produced in the same manner as in Example 1 and evaluated as follows. The battery was charged to 4.25 V, placed in a 60° C. constant temperature oven without disassembling, and kept until the battery temperature reached 60° C. An iron nail (φ 3 mm) was used as the pressing member. First, the nail was applied ultrasonic waves of 40 kHz and then stuck into the electrode group. With respect to the pressure application conditions, the speed was set constant at 0.1 mm/s and the maximum pressure was set to 200 kg/cm². After the nail was stuck into a depth of 0.5 mm, the ultrasonic waves were stopped. Thereafter, a continuing voltage drop was not observed. Further, with the ultrasonic waves being stopped, the nail was further stuck to cause a short-circuit. After the battery voltage reached 4.0 V or less, the nail was further stuck 200 μm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained. This is Example 10.

EXAMPLE 11

A battery A was produced in the same manner as in Example 2 and evaluated as follows. The battery was charged to 4.25 V, placed in a 60° C. constant temperature oven without disassembling, and kept until the battery temperature reached 60° C. An iron nail (φ 3 mm) was used as the pressing member. First, the nail was applied ultrasonic waves of 40 kHz and then stuck into the electrode group. With respect to the pressure application conditions, the speed was set constant at 0.1 mm/s and the maximum pressure was set to 200 kg/cm². After the nail was stuck into a depth of 0.5 mm, the ultrasonic waves were stopped. Thereafter, a continuing voltage drop was not observed. Further, with the ultrasonic waves being stopped, the nail was further stuck to cause a short-circuit. After the battery voltage reached 4.0 V or less, the nail was further stuck 200 μm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained. This is Example 11.

EXAMPLE 12

A battery A was produced in the same manner as in Example 1 and evaluated as follows. The battery was charged to 4.25 V, placed in a 60° C. constant temperature oven without disassembling, and kept until the battery temperature reached 60° C. An iron nail (ϕ 3 mm) was used as the pressing member and stuck into the center of radius of the bottom of the battery. After the battery voltage reached 4.0 V or less due to the occurrence of a short-circuit, the nail was further stuck 300 μm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained. This is Example 12.

EXAMPLE 13

A battery A was produced in the same manner as in Example 2 and evaluated as follows. The battery was charged to 4.25 V, placed in a 60° C. constant temperature oven without disassembling, and kept until the battery temperature reached 60° C. An iron nail (ϕ 3 mm) was used as the pressing member and stuck into the center of radius of the bottom of the battery. After the battery voltage reached 4.0 V or less due to the occurrence of a short-circuit, the nail was further stuck 300 μm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained. This is Example 13.

Table 3 shows the evaluation results of Examples 8 to 13.

TABLE 3

| Example | Evaluation method of internal short-circuit | Exposed part of outermost positive electrode current-collecting terminal | Battery temperature increase | |
|---|---|---|---|---|
| | | | Average (° C.) | Standard deviation |
| 8 | Cutting of insulating layer | Absent | 21 | 2.37 |
| 9 | Cutting of insulating layer | Present | 22 | 2.34 |
| 10 | Ultrasonic nail penetration | Absent | 45 | 3.28 |
| 11 | Ultrasonic nail penetration | Present | 48 | 3.12 |
| 12 | Nail penetration into battery bottom | Absent | 38 | 2.40 |
| 13 | Nail penetration into battery bottom | Present | 40 | 2.46 |

In Example 8 and Example 9 where the internal short-circuit was caused by cutting the insulating layer and applying the pressure, Examples 10 and 11 where the nail was stuck into the inner part by using the ultrasonic waves, and Examples 12 and 13 where the nail was stuck into the bottom of the battery, their batteries exhibited similar temperature increases irrespective of the constitution of the outermost part of the battery. Also, they exhibited small variations in measurement.

(Specification of Safety Level)

Using the same test method as that of the battery A performed in Example 1, the battery B was tested as well. As a result, the average battery temperature increase was 4° C. The battery B, which has the ceramic porous film on the negative electrode surface, has an improved safety in an internal short-circuit condition. This is probably because even in the event of an internal short-circuit, the heat-resistant insulating film serves to prevent the expansion of the short-circuit area. Hence, the amount of Joule's heat generated by the short-circuit is small, so that the safety level of the battery is significantly improved.

In this way, by using the test methods of the present invention, the safety levels of batteries under internal short-circuit conditions could be clearly identified. Thus, in order to indicate suitable uses of batteries and design application devices, the safety levels of batteries or battery packs were specified by placing the following indications on the batteries, battery packs, catalogues specifying battery characteristics, etc.

Battery A "Internal short-circuit 60° C.—foreign object short-circuit 36° C."

Battery B "Internal short-circuit 60° C.—foreign object short-circuit 4° C."

The specification of safety levels is not limited to the above-described indication method and various forms are possible. For example, in addition to numbers representing the above-described test conditions or results, it is possible to employ symbols and characters according to predetermined standards.

The use of the methods and devices for evaluating an internal short-circuit of a battery according to the present invention enables accurate evaluation of safety under an internal short-circuit condition. It is thus possible to provide highly reliable batteries, which is commercially advantageous.

The invention claimed is:

1. An evaluation method for safety upon internal short circuit of a battery, the battery comprising:
an electrode group comprising a positive electrode, a negative electrode, and an insulating layer for electrically insulating the positive and negative electrodes from each other, the positive electrode comprising a positive electrode active material layer and a positive electrode current collector, the negative electrode comprising a negative electrode active material layer and a negative electrode current collector, the positive and negative electrodes and the insulating layer being wound or laminated; an electrolyte;

a housing for housing the electrode group and the electrolyte; and a current-collecting terminal for electrically connecting the electrode group and the housing, the method comprising:

causing an internal short-circuit in the battery, and detecting the occurrence of the internal short-circuit, wherein the internal short-circuit is caused by inserting a foreign object into a location inside the electrode group of the battery where the positive electrode and the negative electrode are opposed to each other from a direction parallel to the surface of the positive electrode or the negative electrode, and applying a pressure to the location into which the foreign object is inserted to locally crush either the insulating layer interposed between the positive and negative electrodes or at least one selected from the positive electrode active material layer and the negative electrode active material layer, together with the insulating layer, and the foreign object is present independently between the positive electrode and the negative electrode and is not joined to the positive electrode or the negative electrode.

2. The evaluation method in accordance with claim 1, wherein the application of the pressure is stopped upon detection of the occurrence of the short-circuit.

3. The evaluation method in accordance with claim 2, wherein the detection of the occurrence of the short-circuit is detection of a drop in battery voltage.

4. The evaluation method in accordance with claim 2, wherein the detection of the occurrence of the short-circuit is detection of a change in battery temperature.

5. The evaluation method in accordance with claim 2, wherein the detection of the occurrence of the short-circuit is detection of sound produced by the internal short-circuit.

6. The evaluation method in accordance with claim 2, wherein the detection of the occurrence of the short-circuit is detection of light produced by the internal short-circuit.

7. The evaluation method in accordance with claim 1, wherein the application of the pressure is performed at a constant speed.

8. The evaluation method in accordance with claim 1, wherein the pressure applied is monitored and the application of the pressure is stopped upon detection of a decrease in the pressure.

9. The evaluation method in accordance with claim 1, wherein the pressure applied is constant.

10. The evaluation method in accordance with claim 1, wherein the pressure applied is 50 kg/cm$^2$ or less.

11. The evaluation method in accordance with claim 1, wherein the foreign object is a conductive foreign object.

12. The evaluation method in accordance with claim 1, wherein the short-circuit is caused by disassembling the battery, taking the electrode group out of the housing, inserting the foreign object into the location inside the electrode group where the positive electrode and the negative electrode are opposed to each other from the direction parallel to the surface of the positive electrode or the negative electrode, reassembling, and applying a pressure.

13. The evaluation method in accordance with claim 1, wherein the short-circuit is caused by disassembling the battery, taking the electrode group from the housing, and inserting an insulating sheet and the foreign object in layers into the location inside the electrode group where the positive electrode and the negative electrode are opposed to each other from the direction parallel to the surface of the positive electrode or the negative electrode, reassembling, pulling out the insulating sheet, and applying a pressure.

14. The evaluation method in accordance with claim 13, wherein the insulating sheet is heat-resistant.

15. The evaluation method in accordance with claim 1, wherein the foreign object is inserted before the electrolyte is injected in a battery production process.

16. The evaluation method in accordance with claim 15, wherein the battery is a lithium secondary battery, the foreign object includes Ni, Cu, stainless steel, or Fe, and the foreign object is placed between the negative electrode and the insulating layer at the location where the positive electrode and the negative electrode are opposed to each other.

17. The evaluation method in accordance with claim 15, wherein the battery is a lithium secondary battery, the foreign object includes Al or stainless steel, and the foreign object is placed between the positive electrode and the insulating layer at the location where the positive electrode and the negative electrode are opposed to each other.

18. The evaluation method in accordance with claim 1, wherein the battery is a lithium secondary battery, and the foreign object is inserted into an electrode such that $d \geq a+b$ where d represents the length of the foreign object in the direction perpendicular to the surface of the electrode, a represents the thickness of the positive electrode active material layer, and b represents the thickness of the insulating layer.

19. The evaluation method in accordance with claim 1, wherein the foreign object is inserted into an electrode such that $d \leq c+e+2b$ where d represents the length of the foreign object in the direction perpendicular to the surface of the electrode, b represents the thickness of the insulating layer, c represents the thickness of the positive electrode, and e represents the thickness of the negative electrode.

20. The evaluation method in accordance with claim 1, wherein the foreign object is anisotropic.

21. The evaluation method in accordance with claim 20, wherein the foreign object has at least one shape selected from the group consisting of a horseshoe-like shape, a cone, a pyramid, a cylinder which has a ratio of length/diameter $\geq 1.5$, and a rectangular parallelepiped which has a ratio of the length of the longest side/the length of the other two sides $\geq 1.5$.

22. The evaluation method in accordance with claim 1, wherein the short-circuit is caused by placing a shape memory alloy or bimetal at a location inside the electrode group of the battery where the positive electrode and the negative electrode are opposed to each other, and changing temperature to deform the shape memory alloy or bimetal and locally crush the insulating layer.

23. The evaluation method in accordance with claim 1, wherein the short-circuit is caused by cutting out a certain area of the insulating layer where the positive electrode and the negative electrode are opposed to each other, and applying a pressure to the cut area.

24. The evaluation method in accordance with claim 23, wherein the insulating layer is cut before the electrode group is assembled.

25. The evaluation method in accordance with claim 23, wherein after the battery is disassembled and the electrode group is taken out of the housing, the insulating layer is cut and then the battery is reassembled.

26. The evaluation method in accordance with claim 1, wherein the short-circuit is caused by cutting out a certain area of the insulating layer where the positive electrode and the negative electrode are opposed to each other, placing an insulating sheet over the cut area, assembling the electrode group, pulling out the insulating sheet, and applying a pressure to the cut area.

27. The evaluation method in accordance with claim 1,
wherein the battery is a lithium secondary battery including a positive electrode that has an exposed part of a current-collecting terminal at an outermost part, and
the short-circuit is caused by inserting a pressing member with a sharp edge into the battery until the pressing member reaches the exposed part of the current-collecting terminal while applying ultrasonic waves thereto, stopping the application of the ultrasonic waves, and then further inserting the pressing member into the battery.

28. The evaluation method in accordance with claim 1,
wherein the battery is a lithium secondary battery including a positive electrode that has an exposed part of a current-collecting terminal at an outermost part, and
the short-circuit is caused by cutting out the exposed part of the current-collecting terminal of the positive electrode at the outermost part without causing a continuing short-circuit, and then inserting a pressing member with a sharp edge into the cut part.

29. The evaluation method in accordance with claim 28, wherein the exposed part of the current-collecting terminal at the outermost part is cut by using an ultrasonic cutter.

30. The evaluation method in accordance with claim 1,
wherein the battery includes a wound electrode group, and the short-circuit is caused by inserting a pressing member with a sharp edge into a bottom of the battery.

31. The evaluation method in accordance with claim 1,
wherein the battery includes a laminated electrode group, and
the short-circuit is caused by inserting a pressing member with a sharp edge into a side face of the battery.

32. The evaluation method in accordance with claim 1,
wherein the battery includes a wound electrode group, and the short-circuit is caused by inserting a pressing member with a sharp edge into a substantially central part of a bottom of the battery slantwise relative to a winding axis of the electrode group.

33. The evaluation method in accordance with claim 1, wherein the short-circuit is caused by locally heating an outer part of the battery to a temperature equal to or higher than the melting point of the insulating layer to melt the insulating layer.

34. The evaluation method in accordance with claim 33, wherein the heating is performed by bringing a heat generator having a temperature equal to or higher than the melting point of the insulating layer close to the battery.

35. The evaluation method in accordance with claim 34, wherein the heat generator is a soldering iron.

36. The method in accordance with claim 33, wherein the outer part of the battery heated to a temperature equal to or higher than the melting point of the insulating layer is a connection area between the housing and
the current-collecting terminal.

37. The evaluation method in accordance with claim 33, wherein the heating is performed after the electrode group is taken out of the housing of the battery.

38. The evaluation method in accordance with claim 37,
wherein the battery is a lithium secondary battery including a positive electrode that has an exposed part of a current-collecting terminal at an outermost part, and
the heating is performed after the electrode group is taken out of the housing of the battery and the exposed part of the current-collecting terminal is cut out.

39. A manufacturing method for a battery whose safety has been specified by any one of the evaluation methods of claim 1.

40. A manufacturing method for a battery pack whose safety has been specified by any one of the evaluation methods of claim 1.

41. A battery produced by the battery manufacturing method of claim 39.

42. A battery pack produced by the battery pack manufacturing method of claim 40.

43. An evaluation device for safety upon battery internal short circuit, comprising:
a pressure applying section for applying a pressure to at least part of the battery;
a pressure-applying-section height-position detecting section for detecting the height position of the pressure applying section;
a pressure controlling section for adjusting the pressure applied by the pressure applying section;
a battery information measuring section for measuring battery information;
at least one short-circuit detecting section for determining whether or not an internal short-circuit has occurred by comparing a measurement result produced by the battery information measuring section with a reference value of an internal short-circuit, the short-circuit detecting section being configured to produce a detection signal of an internal short-circuit depending on a result of the determination; and
at least one controlling section including a control circuit for producing a control signal depending on the detection signal from the short-circuit detecting section and a controller for detecting the control signal from the control circuit.

44. The evaluation device for safety upon battery internal short circuit in accordance with claim 43, further comprising an ultrasonic generator for applying ultrasonic waves to at least part of the battery, and an ultrasonic controller for controlling the ultrasonic generator.

45. A manufacturing method for a battery whose safety has been specified by the internal short-circuit evaluation device of claim 43.

46. A manufacturing method for a battery pack whose safety has been specified by the internal short-circuit evaluation device of claim 43.

47. A battery manufactured by the battery manufacturing method of claim 45.

48. A battery pack manufactured by the battery pack manufacturing method of claim 46.

49. The evaluation method in accordance with claim 1, wherein the foreign object is placed at a location where the positive electrode active material layer of the positive electrode and the negative electrode active material layer of the negative electrode are opposed to each other.

* * * * *